(12) United States Patent
Pietri et al.

(10) Patent No.: US 10,110,244 B1
(45) Date of Patent: Oct. 23, 2018

(54) DIGITAL TO ANALOG CONVERTER (DAC) HAVING SUB-DACS WITH ARRAYS OF RESISTORS

(71) Applicant: NXP USA, INC., Austin, TX (US)

(72) Inventors: Stefano Pietri, Austin, TX (US); James Robert Feddeler, Austin, TX (US); Michael Todd Berens, Austin, TX (US); Yizhong Zhang, Suzhou (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/834,559

(22) Filed: Dec. 7, 2017

(30) Foreign Application Priority Data

Aug. 8, 2017 (CN) .......................... 2017 1 0673370

(51) Int. Cl.
*H03M 1/66* (2006.01)
*H03M 1/68* (2006.01)

(52) U.S. Cl.
CPC ............... *H03M 1/68* (2013.01); *H03M 1/66* (2013.01)

(58) Field of Classification Search
CPC .................................. H03M 1/68; H03M 1/66
USPC .................................................. 341/144, 154
See application file for complete search history.

(56) References Cited

U.S. PATENT DOCUMENTS

| | | | |
|---|---|---|---|
| 5,627,537 A | 5/1997 | Quinlan et al. | |
| 6,448,916 B1 * | 9/2002 | Leung | H03M 1/0663 |
| | | | 341/144 |
| RE38,083 E | 4/2003 | Ashe | |
| 6,633,246 B1 | 10/2003 | Bowers | |
| 7,242,338 B2 * | 7/2007 | Jiang | H03M 1/0682 |
| | | | 341/145 |
| 8,581,766 B1 | 11/2013 | Li et al. | |
| 9,083,380 B2 | 7/2015 | Price et al. | |
| 9,614,542 B2 * | 4/2017 | Worley | H03M 1/68 |
| 2014/0266835 A1 | 9/2014 | Price et al. | |
| 2016/0056834 A1 | 2/2016 | Frank | |

FOREIGN PATENT DOCUMENTS

| | | |
|---|---|---|
| WO | WO 96/16481 | 5/1996 |
| WO | WO 02/13392 A2 | 2/2002 |

OTHER PUBLICATIONS

Xu, Wei, et al., "Research of Segmented 8bit Voltage-Mode R2R Ladder DAC," 2015 IEEE 11th Int'l Conference on ASIC (ASICON), DOI: 10.1109/ASICON.2015.7517105, Nov. 3-6, 2015.

* cited by examiner

*Primary Examiner* — Brian Young

(57) ABSTRACT

A digital to analog converter (DAC) includes a first sub-DAC configured to convert most significant bits (MSBs) of digital input data, the first sub-DAC including a first array of resistors, a second sub-DAC configured to convert at least some least significant bits (LSBs) of the digital input data, the second sub-DAC including a second array of resistors, and a first scaling resistor connected between the first and second sub-DACs, wherein the first scaling resistor has a resistance value that is based on the number of resistors in the second sub-DAC.

19 Claims, 2 Drawing Sheets

$x0 = \frac{3}{4}$

100

DIGITAL TO ANALOG CONVERTER (DAC) HAVING SUB-DACS WITH ARRAYS OF RESISTORS

BACKGROUND

Field

This disclosure relates generally to digital-to-analog converters (DACs), and more specifically, to a DAC having sub-DACs, each with an array of resistors.

Related Art

To achieve a monotonic DAC, different types of DACs may be used, such as a current steering DAC or a resistive DAC. However, current steering DACs require a great amount of current that typically surpasses the allowable total current consumption. One type of resistive DAC currently used is an R-2R architecture which requires less current than current steering DACs and can also achieve high speed. However, the binary scaling at each stage used in a typical R-2R DAC introduces large errors which limit the practical application to an accuracy of only 8-10 bits. Many applications for a DAC, though, require a higher accuracy, such as 12 bits or more. Therefore, a need exists for an improved DAC which allows for a greater accuracy.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a DAC is subdivided into two or more sub-DACs in which each sub-DAC includes an array of resistors. Each sub-DAC corresponds to a non-overlapping portion of the digital input value of the DAC, from the most significant bits (MSBs) to the least significant bits (LSBs). Connected between immediately adjacent sub-DACs is a scaling resistor whose resistance value is based on the number of resistors in the one or more sub-DACs downstream from the scaling resistor towards the lower significant bits. Each resistor used in the DAC is a unit resistor having a resistance of R, in which each resistor can be implemented with any combination of resistors. In this manner, a resistive DAC may be formed which results in a monotonic DAC with reduced power consumption which is suitable for 12-bit resolution.

Figure 1:
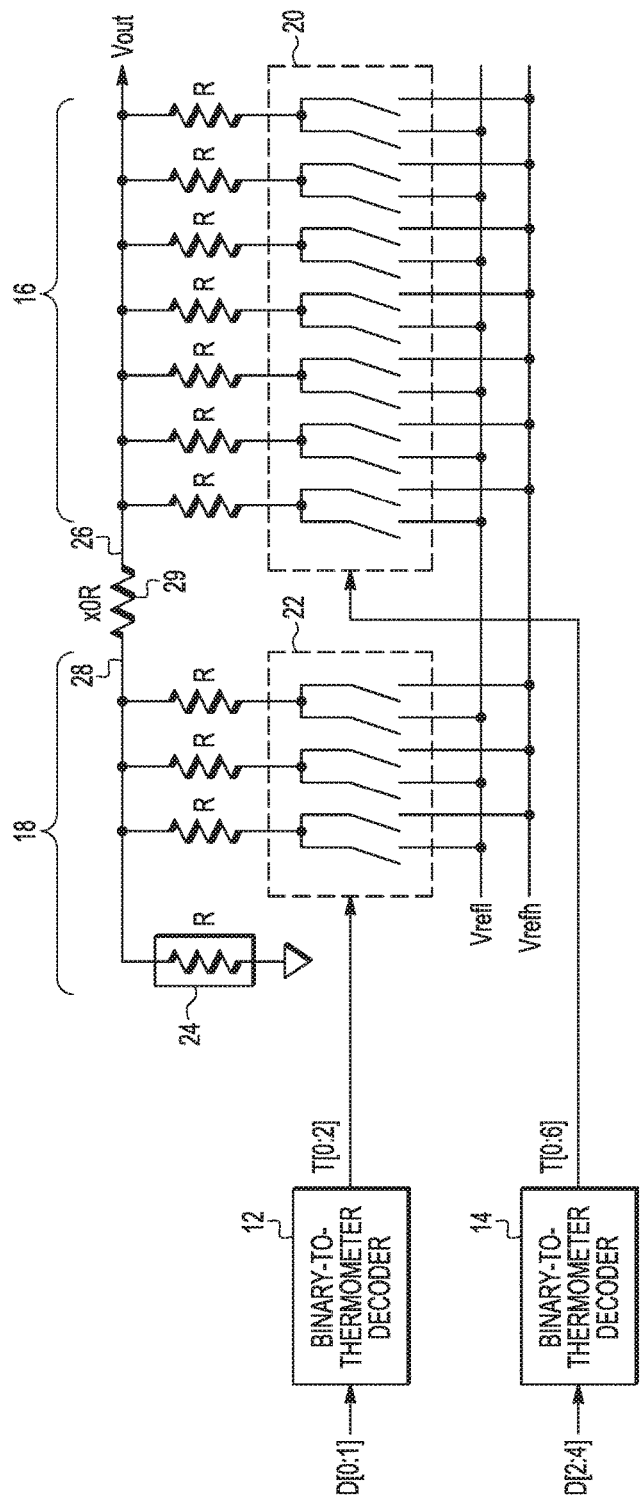
FIG. 1 illustrates, in schematic form, a DAC (DAC) having two sub-DACs in accordance with one embodiment of the present invention.

FIG. 1 illustrates, in schematic form, a DAC 10 in accordance with one embodiment of the present invention. DAC 10 includes binary-to-thermometer decoders 12 and 14 and sub-DACs 18 and 16. Each of binary-to-thermometer decoder 12 and 14 is coupled to receive a portion of a digital input, D, and provide a thermometer vector, T, to a corresponding sub-DAC 18 and 16, respectively. A binary-to-thermometer decoder receives a binary value and provides a T vector which includes, from the LSB to the MSB, a number of 1's equal to the input binary value. If the binary value is a 2-bit value, the thermometer coded data vector T would be a 3-bit value, and if the binary value is a 3-bit value, the thermometer coded data vector T would be a 7 bit value. For example, if the binary input is 0b00, then the thermometer coded data vector would be "000". A binary input of 0b01 would provide a thermometer coded data vector as "100", a binary input of 0b10 would provide a thermometer coded data vector as "110", and a binary input of 0b11 would provide a thermometer coded data vector as "111". Similarly, if the binary input is 0b001, then the thermometer coded data vector is "1000000", and if the binary input is 0b100, then the thermometer coded data vector is "1111000", and if the binary input is 0b110, then the thermometer coded data vector is "1111110". That is, a binary-to-thermometer decoder is configured to receive a digital input data in binary format and provide vector bits with the number of vector bits set to 1 equal to the digital input data starting at bit 0 (i.e., the LSB).

Still referring to FIG. 1, sub-DAC 16 includes a first array of resistors, each having a unit resistance of R, coupled between a circuit node 26 and a bank of switches 20. Node 26 corresponds to an analog output, Vout, of DAC 10. Bank 20 is coupled to a low reference voltage (Vrefl) and a high reference voltage (Vrefh) in which Vrefh is greater than Vrefl. Bank 20 also receives the T vector from binary-to-thermometer decoder 14. Sub-DAC 18 includes a second array of resistors, each having a unit resistance of R, coupled between a circuit node 28 and a bank of switches 22. Bank 22 is coupled to Vrefl and Vrefh and also receives the T vector from binary-to-thermometer decoder 12. Sub-DAC 18 also includes a termination resistor 24 having a unit resistance of R coupled between node 28 and ground. DAC 10 also includes a scaling resistor 29 connected between nodes 28 and 26. Note that a termination resistor (also referred to as terminating resistor) may not be considered part of the corresponding sub-DAC. For example, termination resistor 24 may not be considered to be a part of sub-DAC 18 but coupled between the array of resistors of sub-DAC 18 and ground. Also, note that circuit nodes 28 and 26 are circuit nodes along an output voltage line which provides Vout.

In the illustrated embodiment, DAC 10 is a 5-bit DAC, with a 5-bit input D[0:4]. The 3 MSBs of the input, D[2:4], correspond to sub-DAC 16, and the 2 LSBs of the input, D[0:1], correspond to sub-DAC 18. Referring to sub-DAC 16, each resistor of sub-DAC 16 has a first terminal coupled to node 26 and a second terminal coupled to a pair of switches, in which one switch is coupled to Vrefl and the other to Vrefh. Therefore, depending on which switch is closed, the current through that resistor branch is sinked from node 26 or sourced to node 26. For example, if the switch to Vrefl is closed and the switch to Vrefh is open, current through that resistor branch is sinked from node 26. Alternatively, if the switch to Vrefh is closed and the switch to Vrefl is open, current is sourced through that resistor to node 26. Therefore, each resistor of sub-DAC 16 is connectable to Vrefh or Vrefl, depending on the switches of bank 20. The settings of the switches are determined by the T vector received from binary-to-thermometer decoder 14. Each bit of the 7-bit T vector controls the pair of switches coupled to each of the 7 resistors of the sub-DAC. A value of "1" may indicate that the corresponding resistor is coupled via the appropriate switch to Vrefh, while a value of "0" may indicate that the corresponding resistor is coupled via the appropriate switch to Vrefl. (Note that bank of switches 20 may be implemented using a variety of different switch configurations which appropriately couple each resistor branch to Vrefh or Vrefl based on the corresponding T vector value.)

Each R branch corresponding to the 3 MSBs has an equal weight (due to each having a unit resistance of R). Thus, how many R branches are coupled to Vrefh depends on the value of the 3 MSBs. Therefore, as the digital value of the 3 MSBs increases, more R branches are incrementally connected to Vrefh.

Referring to sub-DAC 18, which corresponds to the 2 LSBs of D, each resistor of sub-DAC 18 has a first terminal coupled to node 28, in which scaling resistor 29 is connected between node 28 and node 26 (i.e. Vout). A first resistor of sub-DAC 18 is termination resistor 24, which has a unit resistance of R, has a first terminal coupled to node 26 and a second terminal coupled to ground. The remaining resistors of sub-DAC 18 each have a first terminal coupled to node 28 and a second terminal coupled to a pair of switches within switch bank 22, in which one switch is coupled to Vrefl and the other to Vrefh. Therefore, depending on which switch is closed, the current through that resistor branch is sinked from node 28 or sourced to node 28, analogous to the description of the resistor branches in sub-DAC 16 described above. Therefore, each resistor of sub-DAC 18 is connectable to Vrefh or Vrefl, depending on the switches of bank 22, and the settings of the switches are determined by the T vector received from binary-to-thermometer decoder 12. Each bit of the 3-bit T vector controls the pair of switches coupled to each of the 3 resistors of the sub-DAC coupled to bank 22. (Note that bank of switches 22 may also be implemented using a variety of different switch configurations which appropriately couple each resistor branch to Vrefh or Vrefl based on the corresponding T vector value.)

Each R branch corresponding to the 2 LSBs has an equal weight (due to each having a unit resistance of R), and how many R branches are coupled to Vrefh depends on the value of the 2 LSBs. Therefore, as the digital value of the 2 LSBs increases, more R branches are incrementally connected to Vrefh. However, due to scaling resistor 29, each resistor branch of sub-DAC 18 sources or sinks a fraction of the current sourced or sinked by each resistor branch in sub-DAC 16. Furthermore, it is desirable to ensure that the impedance of the circuit, when looking in towards node 28 from node 26, appears as another resistor R in parallel with the array of resistors in sub-DAC 16. In this manner, the current through node 28 split among the R branches of sub-DAC 18 is the same as the current through a single R branch of the sub-DAC of the higher significant bits (sub-DAC 16 in this example). Therefore, the scaling value of x0 is determined by the equation "x0=(n0−1)/n0", in which n0 is the number of resistors downstream from scaling resistor 29, coupled to node 28.

Referring to the example of FIG. 1, sub-DAC 18 includes a total of 4 unit resistors, R, including termination resistor 24. Therefore, n0=4 and x0=3/4. In this manner, the total impedance at node 26, when looking towards termination resistor 24, is equivalent to sub-DAC 16 having an array of 8 unit resistors. (Note that scaling resistor 29 has a resistance value based on the number of resistors in the resistor array of least significant bits resistors, e.g. the resistor array of sub-DAC 18, and the termination resistor.)

Figure 2:
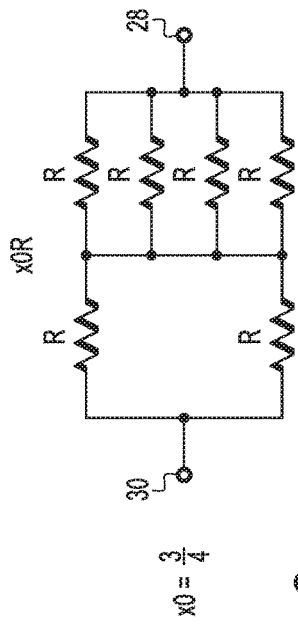
FIG. 2 illustrates, in schematic form, a scaling resistor in accordance with an embodiment of the present invention.

Scaling resistor 29 is implemented using unit resistances, R, coupled in series or parallel, or combinations thereof, as needed. For example, FIG. 2 illustrates an implementation of scaling resistor 29 connected between nodes 28 and 26. That is, to achieve 3/4 R using the unit resistors, 2 unit resistors in parallel are coupled in series with 4 unit resistors in parallel. The equivalent resistance between nodes 28 and 30 is therefore 3/4 R. Note that each unit resistor R in DAC 10 can be implemented with any number and combination of resistors.

The most problematic point for DAC 10 is at the sub-DAC boundary. For example, the most error is introduced when the digital value transitions in a manner that all resistors of the resistor array of sub-DAC 18 are "turned off" or disconnected from Vrefh, and the first R branch of the resistor array of sub-DAC 16 is "turned on" or connected to Vrefh. While this boundary can have nonlinearity, the use of a multi-bit sub-DAC for the MSBs allows the error to be divided out amongst the average of all the MSB resistors. This is an improvement over prior art designs, such as the typical R-2R architecture which incrementally increases current with a binary weighting. As the number of bits of the DAC increases in an R-2R architecture, the LSB bits become far less impactful on the output, and the mismatch in the MSB resistor, weighted at $2^{number\ of\ bits}$, dominates the mismatch. By implementing multiple bits in the MSB sub-DAC the matching requirement placed on the resistors is significantly less. For example, in the illustrated embodiment with 3 MSBs, the linearity will be approximately 8 times better than an R-2R architecture for the same resistor matching coefficients. As the number of bits of the DAC increases in the multiple sub-DAC array architecture, the number of MSBs in sub-DAC 16 can be increased. This allows the architecture to meet the more stringent linearity requirements of the higher resolution DAC with the same resistor matching coefficients.

In the example of FIG. 1, DAC 10 is divided into two sub-DACs, one corresponding to the MSBs and another to the LSBs. However, DAC 10 may be implemented with any number of sub-DACs, in which a first sub-DAC may correspond to the MSBs and a number of additional sub-DACs correspond to non-overlapping portions of the LSBs. As in the example of FIG. 1, each sub-DAC includes an array of resistors in which, between each sub-DAC, is a scaling resistor which makes each equally weighted R branch a fraction of an R branch of the adjacent sub-DAC of the higher significant bits.

Figure 3:
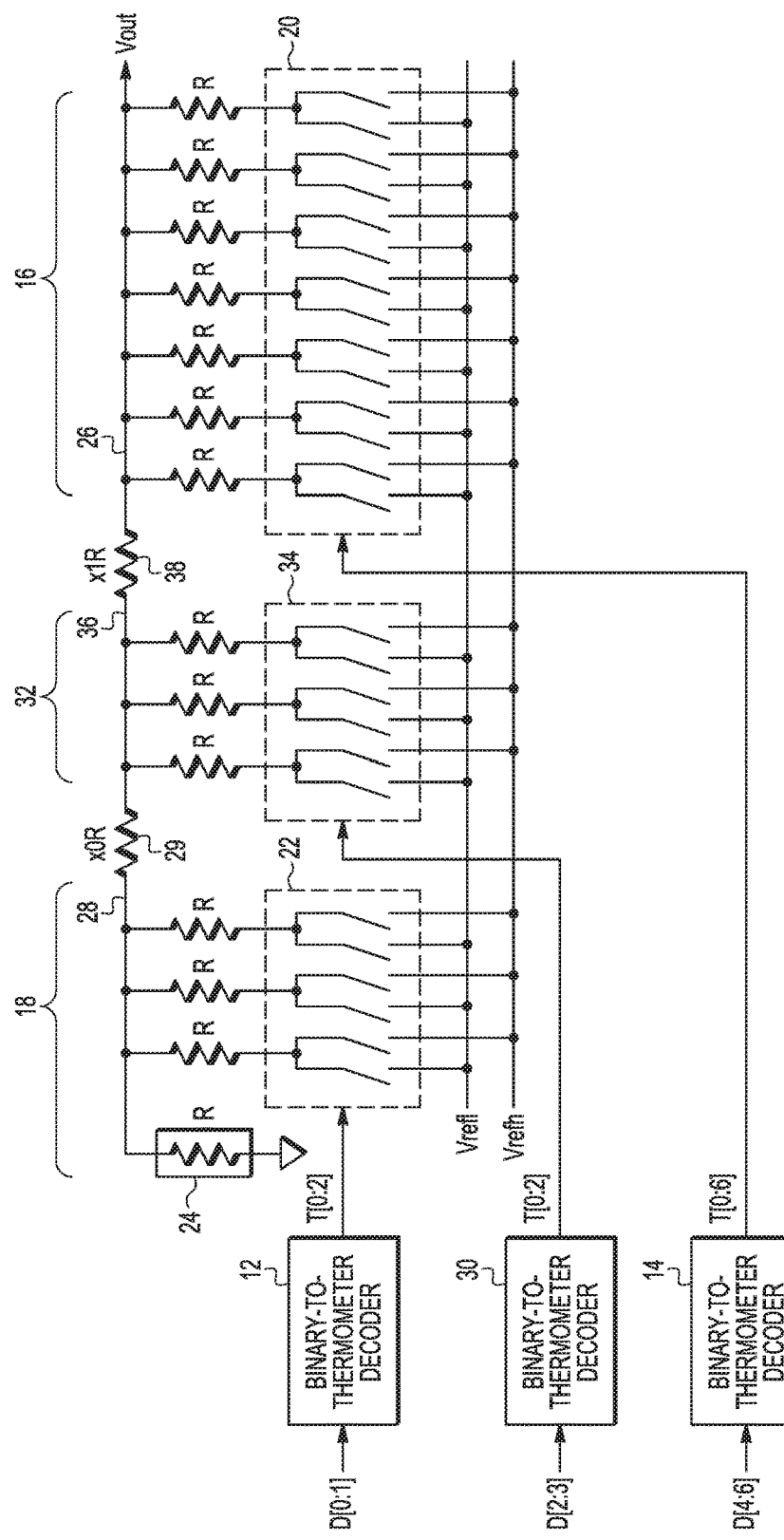
FIG. 3 illustrates, in schematic form, a DAC (DAC) having three sub-DACs in accordance with one embodiment of the present invention.

FIG. 3 illustrates a DAC 100 which is a 7-bit DAC receiving a 7-bit digital value D[0:6] and having 3 sub-DACs in which sub-DAC 16 corresponds to the 3 MSBs, D[4:6], a sub-DAC 32 corresponds to 2 bits of the upper LSBs, D[2:3], and sub-DAC 18 corresponds to 2 bits of the lower LSBs, D[0:1]. Sub-DAC 18, including termination resistor 24, and sub-DAC 16 correspond to sub-DACs 18 and 16 of DAC 10 and operate as described above with respect to FIGS. 1 and 2. However, DAC 100 also includes sub-DAC 32 which corresponds to a third (middle) portion of the digital value.

In addition to binary-to-thermometer decoders 12 and 14, DAC 100 includes a binary-to-thermometer decoder 30 which receives the upper LSBs, D[2:3], and provides a corresponding 3-bit thermometer coded vector T[0:2]. Sub-DAC 32 includes an array of resistors, each having a unit resistance of R, coupled between a circuit node 36 and a bank of switches 34. A scaling resistor 38 is connected between nodes 36 and 26, and scaling resistor 29 is connected between nodes 28 and 36. Note that circuit nodes 28, 36, and 26 are circuit nodes along an output voltage line which provides Vout. Referring to sub-DAC 32, each resistor has a first terminal coupled to node 36 and a second terminal coupled to a pair of switches in switch bank 34, in which one switch is coupled to Vrefl and the other to Vrefh. Therefore, depending on which switch is closed, the current through that resistor branch is sinked from node 36 or sourced to node 36, analogous to the description of the resistor branches in sub-DACs 16 and 18 described above. Therefore, each resistor between scaling resistors 29 and 38 in sub-DAC 32 is connectable to Vrefh or Vrefl, depending on the switches of bank 34, and the settings of the switches are determined by the T vector received from binary-to-thermometer decoder 30. Each bit of the 3-bit T vector controls the pair of switches coupled to each of the 3 resistors of the sub-DAC coupled to bank 34. (Note that bank of switches 34 may also be implemented using a variety of different switch configurations which appropriately couple each resistor branch to Vrefh or Vrefl based on the corresponding T vector value.)

Each R branch corresponding to the upper 2 LSBs has an equal weight (due to each having a unit resistance of R), and how many R branches are coupled to Vrefh depends on the value of the 2 LSBs. Therefore, as the digital value of the upper 2 LSBs increases, more R branches are incrementally connected to Vrefh. However, due to scaling resistor 38, each resistor branch between scaling resistors 29 and 38 of sub-DAC 32 sources or sinks a fraction of the current sourced or sinked by each resistor branch in sub-DAC 16. Furthermore, due to scaling resistor 29, each resistor branch of sub-DAC 18 sources or sinks a fraction of the current source or sinked by each resistor branch in sub-DAC 32.

As described above, the scaling value of x0 for scaling resistor 29 is determined by the equation "x0=(n0−1)/n0", in which n0 is the number of resistors downstream from scaling resistor 29, coupled to node 28. Therefore, as in the example of FIG. 1, n0=4 and x0=¾. Furthermore, the scaling resistor 29 in addition to sub-DAC 18 appears as another resistor R in parallel with the array of resistors in sub-DAC 32, extending from node 36. As above, it is desirable to ensure that the impedance of the circuit, when looking in towards node 28 from node 26 appears as another resistor R in parallel with the array of resistors in sub-DAC 16. In this manner, the current through node 36 split among the R branches of sub-DAC 32 and scaling resistor 29 is the same as the current through a single R branch of the sub-DAC of the higher significant bits (sub-DAC 16 in this example). Therefore, the scaling value of x1 for scaling resistor 38 is determined by the equation "x1=(n1−1)/n1", in which n1 is the effective number of resistors downstream from scaling resistor 38, coupled to node 36. (That is, scaling resistor 38 has a resistance value based at least in part on the number of resistors in the resistor array of sub-DAC 32.)

In the example of FIG. 3, sub-DAC 32 includes 3 unit resistors, R, connected to node 36. Scaling resistor 29 in combination with sub-DAC 18 provide the equivalent of a 4$^{th}$ unit resistor connected to node 36. Therefore, n1=4 and x1=¾. In this manner, the total impedance at node 26, when looking towards termination resistor 24, is still equivalent to sub-DAC 16 having an array of 8 unit resistors, with the last (8$^{th}$) unit resistor being "divided" by sub-DAC 32 and sub-DAC 18 (in which the "4$^{th}$ unit resistor" connected to node 36 of sub-DAC 32 is "divided" by sub-DAC 18). Note that each of scaling resistor 38 and 29 can be implemented with unit resistors, R, as illustrated in FIG. 2.

The most problematic point for DAC 100 is at the sub-DAC boundary, similar to the situation described above in reference to DAC 10. For example, the most error is introduced when the digital value transitions in a manner that all resistors of the resistor array of sub-DAC 32 and sub-DAC 18 are "turned off" or disconnected from Vrefh, and the first R branch of the resistor array of sub-DAC 16 is "turned on" or connected to Vrefh. Similarly, an error can be introduced when the digital value transitions in a manner that all resistors of the resistor array of sub-DAC 18 are "turned off," and the first R branch of the resistor array of sub-DAC 32 connected to node 36 is "turned on". Similar to DAC 10, the use of the resistor arrays in sub-DAC 16 allows for reduced error and improved performance, especially at sub-DAC boundaries. In general, DACs 10 and 100 described herein may require a larger number of resistors to implement the design as compared to some prior art designs (especially as the number of input digital bits increases), however, improved performance is achieved, especially with higher resolution DACs, such as 12-bit DACs.

By now it should be appreciated that there has been provided a segmented resistive DAC which uses arrays of resistors to achieve improved DAC monotonic operation. With each sub-DAC having an array of resistors and corresponding to a non-overlapping portion of the digital input value of the DAC, improved performance can be achieved at the sub-DAC boundaries. To achieve the correct impedance provided by the arrays of resistors, a scaling resistor is connected between immediately adjacent sub-DACs whose resistance value is based on the number of unit resistors in the one or more sub-DACs downstream from the scaling resistor towards the lower significant bits. In this manner, a resistive DAC may be formed which results in a monotonic DAC with reduced power consumption which is suitable for 12-bit resolution.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" or "0b" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front." "back." "top." "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a DAC may be sub-divided into any number of thermometer coded sub-DAC segments, and is not limited to only 2 or 3 sub-DACs. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

One embodiment includes a digital to analog converter (DAC) including a first sub-DAC configured to convert most significant bits (MSBs) of digital input data, the first sub-DAC including a first array of resistors; a second sub-DAC configured to convert at least some least significant bits (LSBs) of the digital input data, the second sub-DAC including a second array of resistors; a first scaling resistor connected between the first and second sub-DACs, wherein the first scaling resistor has a resistance value that is based on the number of resistors in the second sub-DAC. In an aspect of this embodiment, the DAC further includes a third sub-DAC configured to convert other LSBs bits that are not converted by the second sub-DAC; a second scaling resistor connected in series between the second and third sub-DACs, wherein the second scaling resistor has a resistance value that is based on the number of resistors in the third sub-DAC. In a further aspect, one of the second and third sub-DACs further includes a terminating resistor. In another further aspect, each resistor in the first and second array of resistors includes a first terminal connected to an output voltage line, and a second terminal connected to a first terminal of a first switch and a first terminal of a second switch. In yet a further aspect, a second terminal of the first switch is connectable to a low reference voltage and a second terminal of the second switch is connectable to a high reference voltage. In another aspect of this embodiment, the DAC further includes a thermometer decoder configured to receive the digital input data in binary format and provide vector bits with the number of vector bits set to 1 equal to the digital input data starting at bit 0. In a further aspect, each resistor in the first and second arrays of resistors corresponds to one of the vector bits. In another aspect, the DAC further includes a terminating resistor coupled between the array of resistors in the second sub-DAC and ground, wherein the resistance value of the first scaling resistor is based on the terminal resistor along with the number of resistors in the second sub-DAC. In a further aspect, the value of the first scaling resistor is proportional to the number of resistors in the array of resistors in the second sub-DAC plus one for the terminating resistor minus the number one, and inversely proportional to the number of resistors in the array of resistors in the second sub-DAC plus one for the terminating resistor. In another further aspect, the first scaling resistor includes a group of resistors configured in series and parallel combinations to achieve the resistance value of the scaling resistor. In another aspect, a position of first and second switches is controlled by the value of the vector bit that corresponds to each resistor in the first and second arrays of resistors.

In another embodiment, a method of converting digital data to analog data includes decoding the digital data from binary format to vector bits, wherein the number of vector bits set to 1 starting at bit 0 is equal to a value of the digital data; coupling a first terminal of each resistor in an array of most significant bits resistors to a low reference voltage or a high reference voltage based on a value of one of the vector bits corresponding to each resistor in the array of most significant bits resistors, wherein a second terminal of each resistor in the array of most significant bits resistors is connected to an output voltage line; coupling a first terminal of each resistor in an array of least significant bits resistors to the low reference voltage or the high reference voltage based on a value of one of the vector bits corresponding to each resistor in the array of least significant bits resistors, wherein a second terminal of each resistor in the array of least significant bits resistors is connected to the output voltage line; scaling voltage on the output voltage line from the array of least significant bits resistors using a scaling resistor connected in series in the output voltage line between the array of most significant bits resistors and the array of least significant bits resistors, wherein the scaling resistor has a resistance value based on a number of resistors in the array of least significant bits resistors. In one aspect, the method further includes coupling a first terminal of each resistor in a second array of least significant bits resistors to the low reference voltage or the high reference voltage based on a value of one of the vector bits corresponding to each resistor in the second array of least significant bits resistors, wherein a second terminal of each resistor in the second array of least significant bits resistors is connected to the output voltage line; scaling voltage on the output voltage line from the second array of least significant bits resistors using a second scaling resistor connected between the array of least significant bits resistors and the second array of least significant bits resistors, wherein the second scaling resistor has a resistance value based on a number of resistors in the second array of least significant bits resistors. In another aspect, the method further includes lowering voltage on the output voltage line from the array of least significant bits resistors using a terminating resistor coupled to the output voltage line between the array of least significant bits resistors and ground, wherein the resistance value of the first scaling resistor is based on the terminal resistor along with the number of resistors in the array of least significant bits resistors. In another aspect, the scaling resistor comprises a first set of resistors coupled in parallel, a second set of resistors coupled in parallel, and the first set of resistors coupled in series with the second set of resistors. In a further aspect, the value of the scaling resistor is proportional to one less than the number of resistors in the array of least significant bits resistors divided by the number of resistors in the array of least significant bits resistors.

In yet another embodiment, a digital to analog converter (DAC) includes a decoder to decode digital data from binary format to vector bits, wherein the number of vector bits set to 1 starting at bit 0 is equal to a value of the digital data; an array of most significant bits resistors configured to be coupled to a low reference voltage or a high reference voltage based on a value of one of the vector bits corresponding to each resistor in the array of most significant bits resistors, wherein a second terminal of each resistor in the array of most significant bits resistors is connected to a first output node; an array of least significant bits resistors configured to be coupled to the low reference voltage or the high reference voltage based on a value of one of the vector bits corresponding to each resistor in the array of least significant bits resistors, wherein a second terminal of each resistor in the array of least significant bits resistors is connected to a second output node; a scaling resistor having a first terminal connected to the array of most significant bits resistors at the first output node and a second terminal connected to the array of least significant bits resistors at the second output node, wherein the scaling resistor has a resistance value based on a number of resistors in the array of least significant bits resistors. In one aspect of the yet another embodiment, the DAC further includes a second array of least significant bits resistors connected to the low reference voltage or the high reference voltage based on a value of one of the vector bits corresponding to each resistor in the second array of least significant bits resistors, wherein a second terminal of each resistor in the second array of least significant bits resistors is connected to a third output node; a second scaling resistor having one terminal connected to the second output node and a second terminal connected to the third output node, wherein the second scaling resistor has a resistance value based on a number of resistors in the second array of least significant bits resistors. In a further aspect, the DAC further includes a terminating resistor coupled to the third output node between the second array of least significant bits resistors and ground, wherein the resistance value of the second scaling resistor is based on the terminal resistor along with the number of resistors in the second array of least significant bits resistors. In another aspect, the scaling resistor comprises a first set of resistors coupled in parallel, a second set of resistors coupled in parallel, and the first set of resistors coupled in series with the second set of resistors, wherein the value of the scaling resistor is proportional to one less than the number of resistors in the array of least significant bits resistors divided by the number of resistors in the array of least significant bits resistors.

What is claimed is:

1. A digital to analog converter (DAC) comprising:
a first sub-DAC configured to convert most significant bits (MSBs) of digital input data, the first sub-DAC including a first array of resistors;
a second sub-DAC configured to convert at least some least significant bits (LSBs) of the digital input data, the second sub-DAC including a second array of resistors;
a first scaling resistor connected between the first and second sub-DACs, wherein the first scaling resistor has a resistance value that is based on the number of resistors in the second sub-DAC; and
a terminating resistor coupled between the array of resistors in the second sub-DAC and around, wherein the resistance value of the first scaling resistor is based on the terminal resistor along with the number of resistors in the second sub-DAC.

2. A digital to analog converter (DAC) comprising:
a first sub-DAC configured to convert most significant bits (MSBs) of digital input data, the first sub-DAC including a first array of resistors;
a second sub-DAC configured to convert at least some least significant bits (LSBs) of the digital input data, the second sub-DAC including a second array of resistors;
a first scaling resistor connected between the first and second sub-DACs, wherein the first scaling resistor has a resistance value that is based on the number of resistors in the second sub-DAC;
a third sub-DAC configured to convert other LSBs bits that are not converted by the second sub-DAC; and
a second scaling resistor connected in series between the second and third sub-DACs, wherein the second scaling resistor has a resistance value that is based on the number of resistors in the third sub-DAC.

3. The DAC of claim 2 wherein one of the second and third sub-DACs further includes a terminating resistor.

4. The DAC of claim 2 wherein each resistor in the first and second array of resistors includes a first terminal connected to an output voltage line, and a second terminal connected to a first terminal of a first switch and a first terminal of a second switch.

5. The DAC of claim 4 wherein:
a second terminal of the first switch is connectable to a low reference voltage and a second terminal of the second switch is connectable to a high reference voltage.

6. A digital to analog converter (DAC) comprising:
a first sub-DAC configured to convert most significant bits (MSBs) of digital input data, the first sub-DAC including a first array of resistors;
a second sub-DAC configured to convert at least some least significant bits (LSBs) of the digital input data, the second sub-DAC including a second array of resistors;
a first scaling resistor connected between the first and second sub-DACs, wherein the first scaling resistor has a resistance value that is based on the number of resistors in the second sub-DAC; and
a thermometer decoder configured to receive the digital input data in binary format and provide vector bits with the number of vector bits set to 1 equal to the digital input data starting at bit 0.

7. The DAC of claim 6 wherein:
each resistor in the first and second arrays of resistors corresponds to one of the vector bits.

8. The DAC of claim 1 wherein the value of the first scaling resistor is proportional to the number of resistors in the array of resistors in the second sub-DAC plus one for the terminating resistor minus the number one, and inversely proportional to the number of resistors in the array of resistors in the second sub-DAC plus one for the terminating resistor.

9. The DAC of claim 1 wherein the first scaling resistor includes a group of resistors configured in series and parallel combinations to achieve the resistance value of the scaling resistor.

10. The DAC of claim 5 wherein:
a position of first and second switches is controlled by the value of the vector bit that corresponds to each resistor in the first and second arrays of resistors.

11. A method of converting digital data to analog data comprising:
decoding the digital data from binary format to vector bits, wherein the number of vector bits set to 1 starting at bit 0 is equal to a value of the digital data;
coupling a first terminal of each resistor in an array of most significant bits resistors to a low reference voltage or a high reference voltage based on a value of one of the vector bits corresponding to each resistor in the array of most significant bits resistors, wherein a second terminal of each resistor in the array of most significant bits resistors is connected to an output voltage line;
coupling a first terminal of each resistor in an array of least significant bits resistors to the low reference voltage or the high reference voltage based on a value of one of the vector bits corresponding to each resistor in the array of least significant bits resistors, wherein a second terminal of each resistor in the array of least significant bits resistors is connected to the output voltage line;
scaling voltage on the output voltage line from the array of least significant bits resistors using a scaling resistor connected in series in the output voltage line between the array of most significant bits resistors and the array of least significant bits resistors, wherein the scaling resistor has a resistance value based on a number of resistors in the array of least significant bits resistors.

12. The method of claim 11 further comprising:
coupling a first terminal of each resistor in a second array of least significant bits resistors to the low reference voltage or the high reference voltage based on a value of one of the vector bits corresponding to each resistor in the second array of least significant bits resistors, wherein a second terminal of each resistor in the second array of least significant bits resistors is connected to the output voltage line;
scaling voltage on the output voltage line from the second array of least significant bits resistors using a second scaling resistor connected between the array of least significant bits resistors and the second array of least significant bits resistors, wherein the second scaling resistor has a resistance value based on a number of resistors in the second array of least significant bits resistors.

13. The method of claim 11 further comprising:
lowering voltage on the output voltage line from the array of least significant bits resistors using a terminating resistor coupled to the output voltage line between the array of least significant bits resistors and ground, wherein the resistance value of the first scaling resistor is based on the terminal resistor along with the number of resistors in the array of least significant bits resistors.

14. The method of claim 11 wherein:
the scaling resistor comprises a first set of resistors coupled in parallel, a second set of resistors coupled in parallel, and the first set of resistors coupled in series with the second set of resistors.

15. The method of claim 14 wherein:
the value of the scaling resistor is proportional to one less than the number of resistors in the array of least significant bits resistors divided by
the number of resistors in the array of least significant bits resistors.

16. A digital to analog converter (DAC) comprising:
a decoder to decode digital data from binary format to vector bits, wherein the number of vector bits set to 1 starting at bit 0 is equal to a value of the digital data;
an array of most significant bits resistors configured to be coupled to a low reference voltage or a high reference voltage based on a value of one of the vector bits corresponding to each resistor in the array of most significant bits resistors, wherein a second terminal of each resistor in the array of most significant bits resistors is connected to a first output node;
an array of least significant bits resistors configured to be coupled to the low reference voltage or the high reference voltage based on a value of one of the vector bits corresponding to each resistor in the array of least significant bits resistors, wherein a second terminal of each resistor in the array of least significant bits resistors is connected to a second output node;
a scaling resistor having a first terminal connected to the array of most significant bits resistors at the first output node and a second terminal connected to the array of least significant bits resistors at the second output node, wherein the scaling resistor has a resistance value based on a number of resistors in the array of least significant bits resistors.

17. The DAC of claim 16 further comprising:
a second array of least significant bits resistors connected to the low reference voltage or the high reference voltage based on a value of one of the vector bits corresponding to each resistor in the second array of least significant bits resistors, wherein a second terminal of each resistor in the second array of least significant bits resistors is connected to a third output node;
a second scaling resistor having one terminal connected to the second output node and a second terminal connected to the third output node, wherein the second scaling resistor has a resistance value based on a number of resistors in the second array of least significant bits resistors.

18. The DAC of claim 17 further comprising:
a terminating resistor coupled to the third output node between the second array of least significant bits resistors and ground, wherein the resistance value of the second scaling resistor is based on the terminal resistor along with the number of resistors in the second array of least significant bits resistors.

19. The DAC of claim 16 wherein:
the scaling resistor comprises a first set of resistors coupled in parallel, a second set of resistors coupled in parallel, and the first set of resistors coupled in series with the second set of resistors, wherein the value of the scaling resistor is proportional to one less than the number of resistors in the array of least significant bits resistors divided by the number of resistors in the array of least significant bits resistors.

* * * * *